United States Patent
Yoshizaki

(12)
(10) Patent No.: US 6,414,523 B1
(45) Date of Patent: Jul. 2, 2002

(54) PULL-UP METHOD AND APPARATUS FOR A UNIVERSAL SERIAL BUS OUTPUT DRIVER

(75) Inventor: Shoichi Yoshizaki, Sunnyvale, CA (US)

(73) Assignee: Matsushita Electrical Industrial Co., Ltd., Osaka (JP)

( * ) Notice: Subject to any disclaimer, the term of this patent is extended or adjusted under 35 U.S.C. 154(b) by 0 days.

(21) Appl. No.: 09/490,693

(22) Filed: Jan. 24, 2000

(51) Int. Cl.[7] .............................. H03B 1/00; H03K 3/00
(52) U.S. Cl. ...................... 327/112; 327/170; 327/374; 327/78; 327/77; 326/86; 326/87
(58) Field of Search .............................. 326/26, 27, 82, 326/83, 86, 87; 327/108–112, 427, 434, 170, 77, 78, 80, 81, 374

(56) References Cited

U.S. PATENT DOCUMENTS

| | | | | |
|---|---|---|---|---|
| 5,122,690 A | * | 6/1992 | Bianchi | 326/87 |
| 5,166,555 A | * | 11/1992 | Kano | 326/87 |
| 5,184,033 A | | 2/1993 | Chiao et al. | 326/87 |
| 5,287,022 A | | 2/1994 | Wilsher | 327/310 |
| 5,332,932 A | * | 7/1994 | Runaldue | 326/82 |
| 5,479,124 A | | 12/1995 | Pun et al. | 327/108 |
| 5,534,791 A | * | 7/1996 | Mattos et al. | 326/27 |
| 5,537,060 A | * | 7/1996 | Baek | 326/87 |
| 5,539,333 A | | 7/1996 | Cao et al. | 326/83 |
| 5,719,509 A | * | 2/1998 | Chan | 327/112 |
| 5,801,564 A | | 9/1998 | Gasparik | 327/170 |
| 5,808,481 A | | 9/1998 | Thompson | 326/83 |
| 5,825,206 A | * | 10/1998 | Krishnamurthy et al. | 326/87 |
| 5,831,447 A | * | 11/1998 | Chaw | 326/87 |
| 5,973,512 A | | 10/1999 | Baker | 326/87 |

OTHER PUBLICATIONS

Anderson, D., (1997) *Universal Serial Bus System Architecture*, MindShare, Inc., PC System Architecture Series, Addison–Wesley Developers Press, ISBN 0–201–46137–4, 4 pages.

Jaff, Kosar, (1996) *The USB Handbook based on USB Specification Revision 1.0*, Anabooks, San Diego, ISBN 0–929392–39–6, 2 pages.

Panasonic Semiconductor, (Apr. 24, 1998) MN5573 USB Hub Controller, Rev. 1.3, 22 pages.

* cited by examiner

Primary Examiner—Terry D. Cunningham
Assistant Examiner—Long Nguyen
(74) Attorney, Agent, or Firm—Morrison & Foerster LLP

(57) ABSTRACT

Disclosed is an output driver for driving a universal serial bus. The driver includes a first pull-up circuit, a second pull-up circuit, and a crossover detection circuit. The driver uses the first pull-up circuit to drive the output up to first predetermined voltage. The crossover detection circuit detects the first predetermined voltage and switches to driving the output with the second pull-up circuit. The second pull-up circuit drives output up to a second predetermined target voltage. By driving the output up to only the target voltage using the second pull-up circuit, the likelihood of oscillations about the target voltage can be reduced.

9 Claims, 5 Drawing Sheets

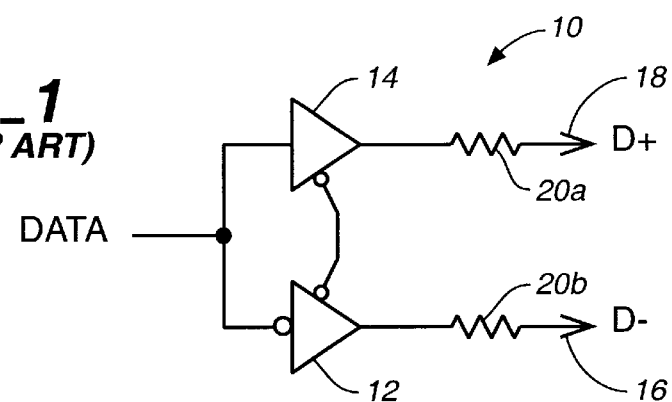
FIG._1
*(PRIOR ART)*
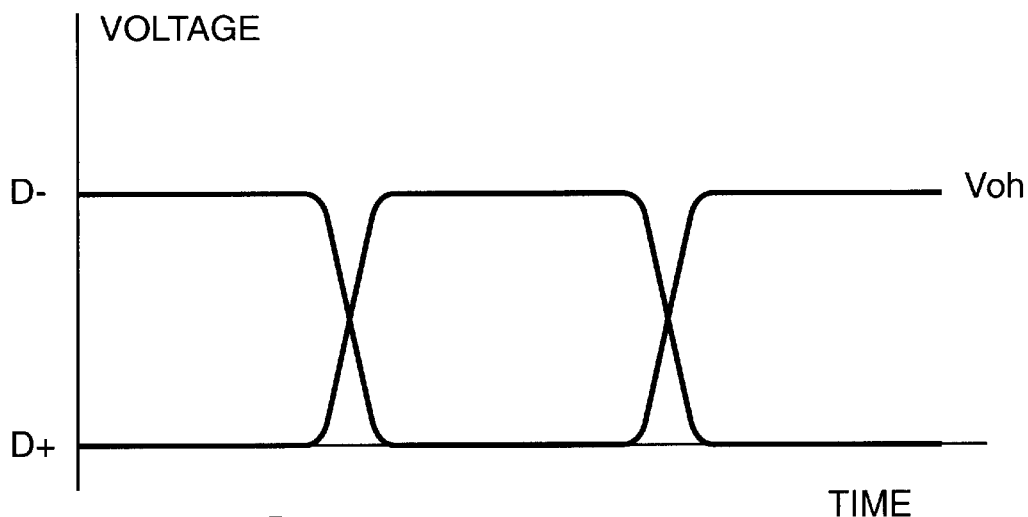
FIG._2
*(PRIOR ART)*
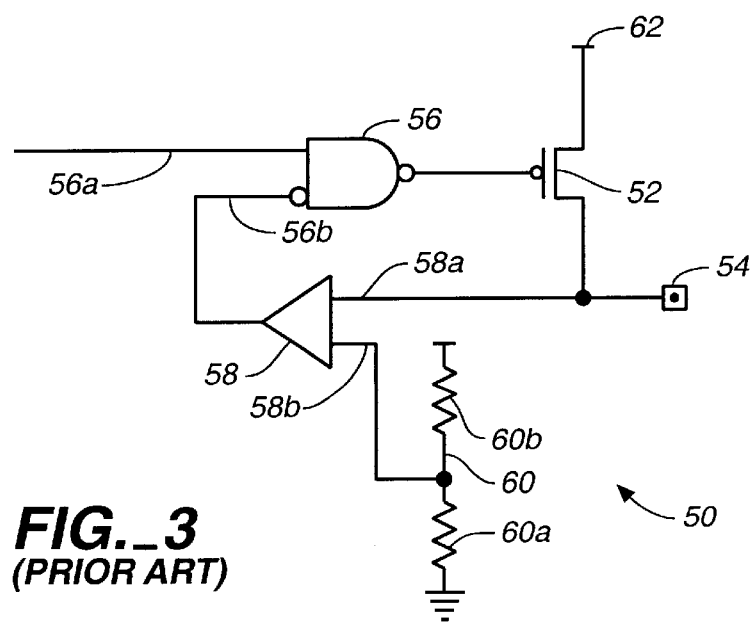
FIG._3
*(PRIOR ART)*

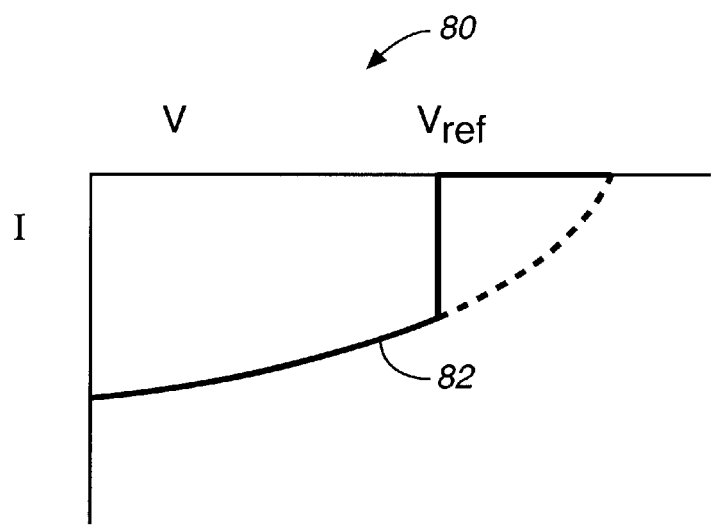
FIG._4
(PRIOR ART)
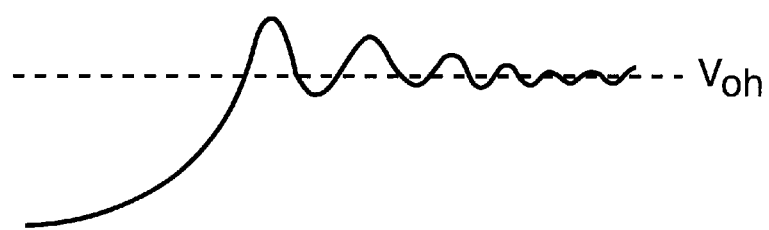
FIG._5
(PRIOR ART)
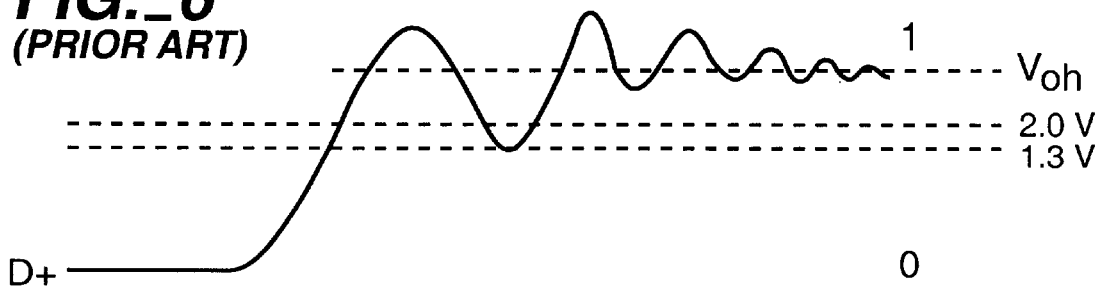
FIG._6
(PRIOR ART)

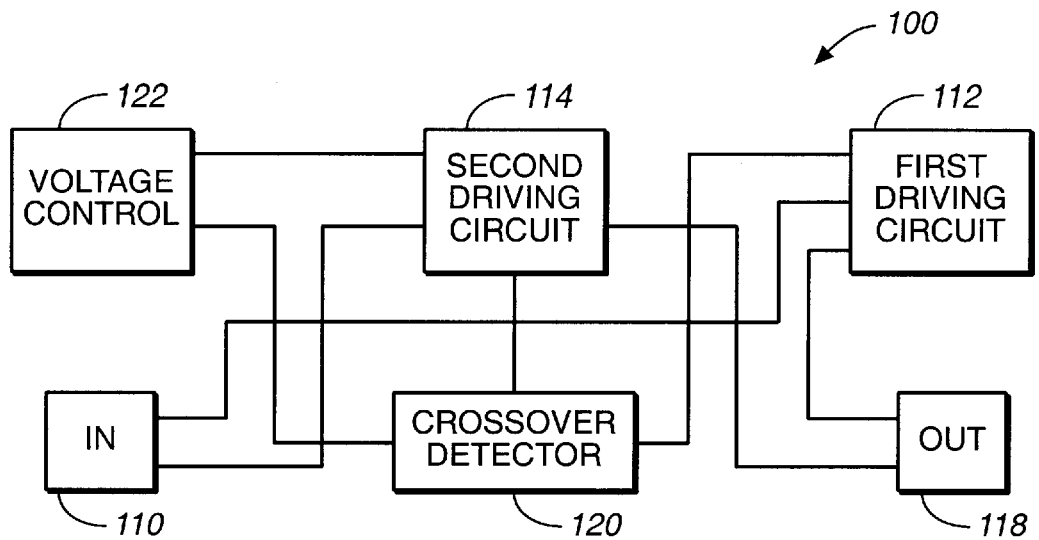
*FIG._7*
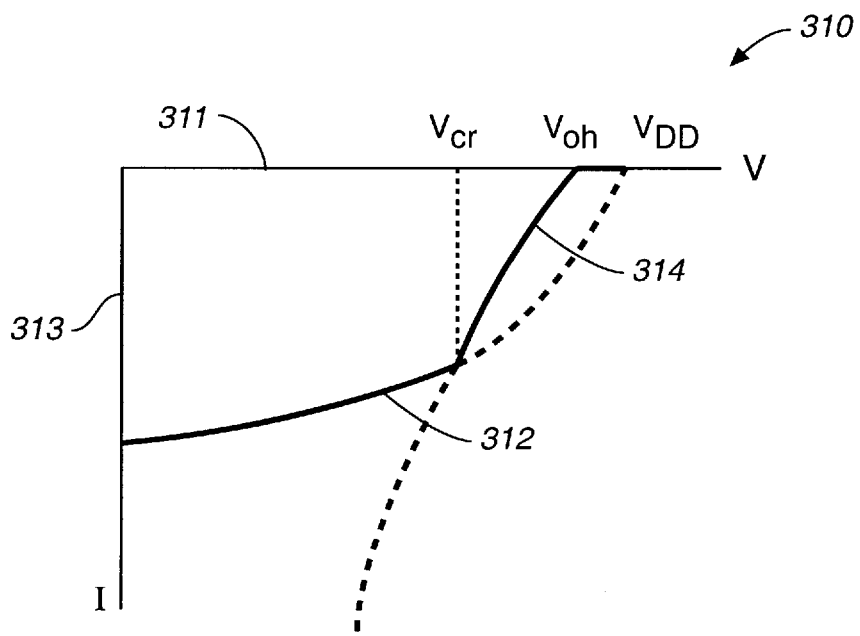
*FIG._9*

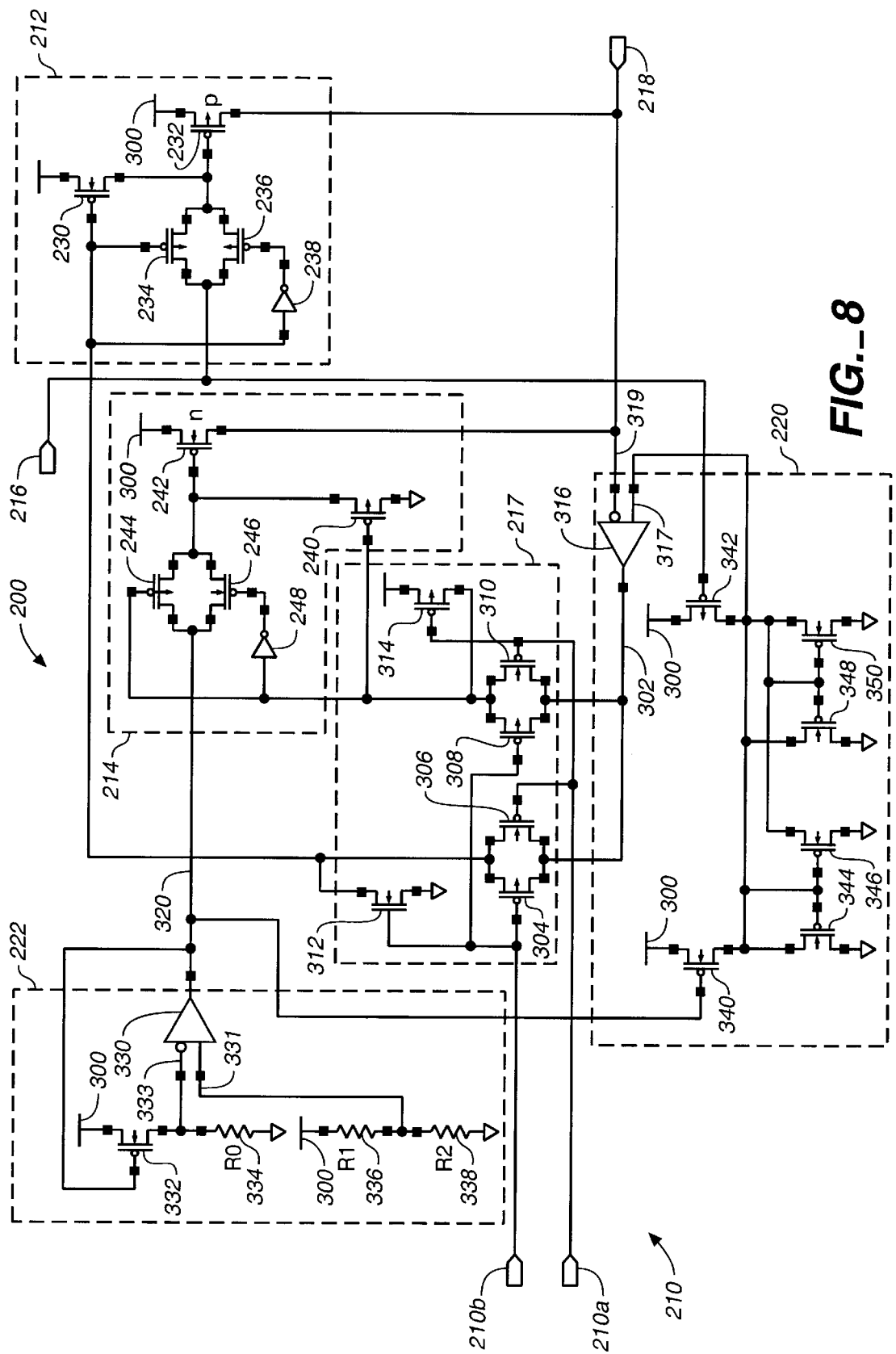
FIG._8

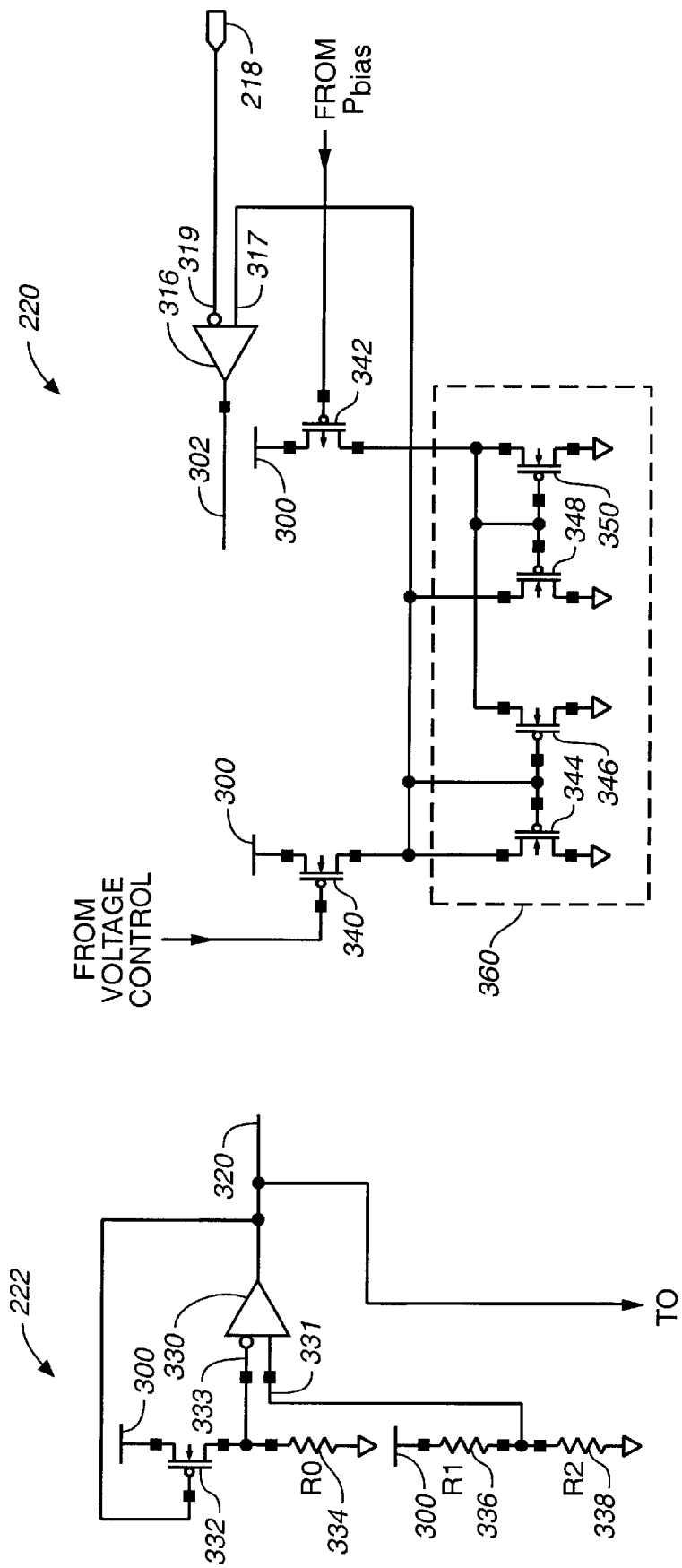
FIG._11
FIG._10

PULL-UP METHOD AND APPARATUS FOR A UNIVERSAL SERIAL BUS OUTPUT DRIVER

TECHNICAL FIELD

The present invention relates to output drivers for Universal Serial Bus (USB) devices. In particular, the present invention includes a CMOS pull-up circuit for a differential output driver.

BACKGROUND ART

The universal serial bus (USB) is a computer bus architecture used for connection of information processing devices, such as peripheral computer devices, to a personal computer (PC). For a number of reasons, use of a USB in peripheral device interconnection has become desirable. First, a wide range of information processing devices can be interconnected to other information processing devices, such as PCs, via the USB. For example, a PC's keyboard, mouse, printer, scanner, modem, audio devices and video devices, can all be connected via the USB. Also, the USB allows connection of these and other peripheral devices using only a single connector type. Additionally, device attachment is automatically detected by the USB and software automatically configures the device for immediate use, without user intervention.

A USB device is interconnected with, and transfers data to and from, a PC via a USB cable. The USB uses a differential output driver to drive a USB data signal onto the USB cable. FIG. 1 is a schematic diagram of one example of a differential output driver 10 which can be used to drive the USB cable. Output driver 10 uses both an inverting buffer 12 and a non-inverting buffer 14. An input data signal is applied to both buffers 12 and 14, yielding a D– output 16 and a D+ output 18. Resistors 20a and 20b are provided in each output line to generate output resistance. In accordance with standard USB specifications, each resistor 20 and 20b typically has an impedance of approximately 27 ohms.

An ideal D+ and D– signal generated by output driver 10 is shown in FIG. 2 which is a voltage versus time output graph showing how D+ and D– signals should appear on outputs 18 and 16, respectively, of driver 10. By USB specifications, the high state voltage Voh should be between 2.8 and 3.6 volts. Additionally, to meet USB specifications, an output signal crossover voltage where the output changes digital state must be between 1.3 and 2.0 volts.

Also according to USB specifications, the supply voltage for the USB driver 10 should be from 4.40 to 5.25 volts. Thus, because the high state voltage, Voh, should be between 2.8 and 3.6 volts, the output driver 10 cannot be connected directly to supply voltage. Rather, a separate pull-up circuit is required to maintain a high state voltage of between 2.8 and 3.6 volts.

An example of a previous pull-up circuit 50 which has been used to maintain a high state voltage of between 2.8 and 3.6 volts is shown in FIG. 3. Pull-up circuit 50 includes a driving transistor 52, the source of which is connected to an output pad 54. Output pad 54 is used to drive the USB cable (not shown). A high state voltage on output pad 54 must be between 2.8 and 3.6 volts. The gate of driving transistor 52 is connected to the output of a NAND gate 56. The drain of driving transistor 52 is connected to the supply voltage 62 (4.40 to 5.25 volts), and the source of driving transistor 52 is connected to output 54. A first input 56a of NAND gate 56 serves as the input to pull-up circuit 50. When first input 56a is high, as explained below, pull-up circuit 50 causes output pad 54 to go high. A second input 56b of NAND gate 56 is driven by the output of a comparator 58. A first input 58a of comparator 58 is connected to output pad 54 and a second input 58b to comparator 58 is driven by a voltage divider 60.

When input 56a to NAND gate 56 is high, the output of NAND gate 56 can go low. This allows driving transistor 52 to be turned on (because the gate of driving transistor 52 is inverted) to pull-up output pad 54 to a digital high state (that is, to a voltage of from 2.8 to 3.6 volts). When input 56a is high, the remainder of pull-up circuit holds output pad 54 in a digital high state. Specifically, voltage divider 60, including resistors 60a and 60b, is connected between the power supply voltage of from 4.40 to 5.25 volts and ground. Divider 60 divides this voltage down to the specified high state voltage of between 2.8 and 3.6 volts (Voh). Comparator 58 compares this voltage to the voltage on output pad 54. If the voltage on output pad 54 is higher than Voh, then the output of comparator 58 is high. If the voltage on output pad 54 is lower than Voh, then the output of comparator 58 is low. Thus, when the voltage on output pad 54 is higher than Voh, the output of NAND gate 56 is high (because input 56b is inverted) and driving transistor 52 is turned off (because the gate of driving transistor 52 is inverted). When driving transistor 52 is off, the voltage at output pad 54 will drop below Voh, and the output of comparator 58 goes low to turn on driving transistor 52. This brings the voltage at output pad 54 back up above Voh.

If a driving transistor 52 is a PMOS device, an approximate resultant voltage versus current characteristic 82 which is generated on output pad 54 is shown in FIG. 4 which is a voltage versus current graph 80 of the output of pull-up circuit 50. When V reaches Voh, the output of comparator 58 will go low, shutting off driving transistor 52. This causes the voltage at output pad 54 to drop below Voh again, turning on driving transistor 52. The resultant voltage at output pad 54, when input 56a is switched high, is shown in FIG. 5, which is a time versus voltage graph of the voltage at output pad 54. As shown, once the voltage reaches Voh, it is not held constant. Rather the voltage at output pad 54 oscillates about Voh with the largest excursions from Voh occurring just after input 56a goes high. FIG. 6 shows the signal illustrated in FIG. 5 superimposed on a portion of the ideal differential signal to be generated by output driver 10 shown in FIG. 2. As shown, particularly just after a state transition occurs, the oscillations of the voltage at output pad 54 can cause the rising differential signal to drop back below a state change voltage. Specifically, under USB specifications, a signal should change from a digital low state to a digital high state between 1.3 volts and 2.0 volts. Oscillating across this voltage could trigger a "false" state change from a high state (1) to a low state (0), as shown in FIG. 6. This could undesirably cause an error in data transmission on the USB bus.

Accordingly, improvement is needed in USB pull-up circuits. Specifically, the pull-up circuit should be able to drive the USB bus at the appropriate high state voltage without causing excessive oscillations or ringing which might generate data errors.

SUMMARY OF THE INVENTION

The present invention includes a method and apparatus for driving a USB which substantially eliminates ringing or oscillation around a target voltage. An electronic output driver in accordance with a present invention includes an output for providing an electrical signal, a first pull up circuit, a second pull up circuit, and a detection circuit in electrical communication with the first pull up circuit and the second pull up circuit. The first pull up circuit is in at least intermittent electrical communication with the output to provide a first voltage range to the output. The second pull-up circuit is also in at least intermittent electrical communication with the output and drives the output up to a predetermined voltage. The detection circuit detects the voltage of the output and selects the first pull up circuit or the second pull up circuit to drive the output. Preferably, the detection circuit selects either the first pull-up circuit or the second pull up circuit depending upon the voltage at the output.

Because the second pull up circuit drives the output up to a predetermined voltage, there is substantially no ringing or oscillation around the predetermined voltage. This can advantageously reduce the likelihood of a false state change signal being transmitted over the USB.

A method of driving an electrical output of an output driver in accordance with the present invention includes providing a first pull-up circuit and a second pull up circuit. The first pull-up circuit is connectable to the electrical output and is for driving the output over first range of voltages. The second pull-up circuit is also connectable to the output and is for driving the output over second range of voltages up to a first predetermined voltage. The output is driven with either the first pull-up circuit or the second pull-up circuit. The output is switched from being driven by the first pull-up circuit to the second pull-up circuit when the output reaches a second predetermined voltage.

BRIEF DESCRIPTION OF THE DRAWINGS

FIG. 1 is a schematic diagram of a differential output driver 10 which can be used to drive a Universal Serial Bus (USB) cable.

FIG. 2 is a time versus voltage graph of an ideal output signal of the differential output driver shown in FIG. 1.

FIG. 3 is a schematic diagram of an earlier pull-up circuit used to pull up an output of the differential output driver shown in FIG. 1 to a digital high state.

FIG. 4 is an approximate voltage versus current graph of the output of the pull-up circuit shown in FIG. 3.

FIG. 5 is a detailed time versus voltage graph of the output of the pull-up circuit shown in FIG. 3.

FIG. 6 is a time versus voltage graph of the superimposition of a portion of the differential signal shown in FIG. 2 with the pull-up circuit output signal shown in FIG. 5.

FIG. 7 is a block diagram showing the interconnection of circuit components in a USB output driver in accordance with the present invention.

FIG. 8 is a schematic diagram of a first embodiment of a USB output driver in accordance with the present invention.

FIG. 9 is a is a voltage versus current graph showing the characteristics of the driving transistors of the USB output driver shown in FIG. 8.

FIG. 10 is a schematic diagram of the voltage supply of the USB output driver shown in FIG. 8.

FIG. 11 is a schematic diagram of the crossover detector of the USB output driver shown in FIG. 8.

DETAILED DESCRIPTION

The present invention includes a method and apparatus for driving the output of a Universal Serial Bus (USB) device. FIG. 7 is a block diagram illustrating one embodiment of a pull-up mechanism 100 for driving the output of a USB output buffer in accordance with the present invention. Pull-up mechanism 100 includes an input 110, a first driving circuit 112, a second driving circuit 114 and an output 118. Input 110 is connected to both first driving circuit 112 and second driving circuit 114. First and second driving circuits 112 and 114, respectively, are each connected to output 118. Pull-up mechanism 100 also includes a crossover detector 120 interconnected to first driving circuit 112, second driving circuit 114, and input 110. Crossover detector 120 is for sequentially driving output 118 with first driving circuit 112 and then second driving circuit 114.

Additionally, a power supply (not shown) is connected to pull-up mechanism 100 to supply power thereto.

Input 110 is a digital input and can transition from a digital high state to a digital low state. When input 110 transitions to a high state first driving circuit 112 is activated. When first driving circuit 112 is activated, it begins to pull up the voltage on output 118 to a high state voltage (Voh) which is preferably, but not necessarily between 2.8 and 3.6 volts. However, before first driving circuit 112 fully pulls output 118 up to Voh, crossover detector 120 switches out first driving circuit 112 from driving output 118 and switches in second driving circuit 114 to pull output 118 all the way up to Voh. Crossover detector 120 does this by detecting when a crossover voltage, Vcr, has been reached on output 118. As will be explained in detail below, the crossover voltage is the voltage at which the voltage versus current characteristic of first driving circuit 112 intersects with the voltage versus current characteristic of second driving circuit 114. Preferably, Vcr is between 1.3 volts and 2.0 volts. Crossover detector preferably then causes the output of first driving circuit 112 to float and causes output of second driving circuit 114 to drive output 118 to Voh. Additionally, during the time in which first driving circuit 112 is driving output 118, crossover detector 120 preferably causes the output of the second driving detector to float.

To allow second driving circuit 114 to drive output 118 only to Voh and hold it at this voltage, second driving circuit 114 is preferably driven by a voltage control 122 which is connected to both second driving circuit 114 and crossover detector 120. As explained in detail below, voltage control 122 is configured to drive second driving circuit 114 only up to Voh. Additionally, as will be explained in greater detail below, crossover circuit 120 is connected to both voltage control 122 and voltage supply 124 to allow crossover circuit 120 to determine the crossover voltage Vcr where the first driving circuit 112 is deactivated or allowed to float, and the second driving circuit 114 is activated to drive output 118.

FIG. 8 is a schematic diagram showing a first embodiment of a USB driver 200 in accordance with the present invention. USB driver 200 includes an input 210, an output 218, a first driving circuit 212, a second driving circuit 214, an activation circuit 217, and a crossover detector 220. First driving circuit 212 and second driving circuit 214 are both connected to output 218 to drive output 218 which is connected to a USB (not shown). Input 210 includes an enable input 210*a* and a non-enable input 210*b* which can be used to activate or deactivate USB driver 200. Both enable input 210*a* and non-enable input 210*b* are connected to activation circuit 217, which will be described in greater detail below. Crossover detector 220 is also connected to activation circuit 217 which is then connected to both first driving circuit 212 and second driving circuit 214. Crossover detector 220 causes either first driving circuit 212 or second driving circuit 214 to drive output 218 depending on the voltage level of output 218. USB driver 200 also includes a voltage control 222 connected to second driving circuit 214 to allow second driving circuit 214 to drive output 218 at the USB specification high voltage Voh. USB driver 200 also includes a P-bias voltage 216 which is connected to first driving circuit 212 to allow first driving circuit 212 to provide a voltage to output 218. As discussed in greater detail below, both P-bias voltage 216 and voltage control 222 are also connected to crossover detector 220 to allow crossover detector 220 to appropriately cause either first driving circuit 212 or second driving circuit 214 to drive output 218.

When enabling input 210a goes high, USB driver 200 drives output 218 using, sequentially, first driving circuit 212 and then second driving circuit 214. As shown in FIG. 8, first driving circuit 212 preferably includes a cutout transistor 230, a driving transistor 232, first and second switching transistors 234 and 236, respectively, and inverting buffer 238. Second driving circuit 214 preferably includes a cutout transistor 240, driving transistor 242, first and second switching transistors 244 and 246, respectively, and inverting buffer 248. Preferably, driving transistor 232 of first driving circuit 212 is the component thereof that directly drives output 218 and driving transistor 242 of second driving circuit 214 is the component thereof that directly drives output 218. Preferably, driving transistor 232 of first driving circuit 212 is a PMOS device and driving transistor 242 of second driving circuit 214 is an NMOS device.

As shown in FIG. 8, the drain of driving transistor 232 is connected to power supply voltage 300, which is preferably from 4.75 volts to 5.25 volts. Also, as will be discussed below in greater detail, when output 218 is being driven by first driving circuit 212, the gate of driving transistor 232 is connected to P-bias voltage 216. FIG. 9 is a voltage versus current graph 310 showing the voltage on output 218 on horizontal axis 311 and current on output 218 on vertical axis 313. Graph 310 shows the resultant PMOS voltage versus current characteristic 312 (partially in phantom) of output 218 when it is driven by first driving circuit 212. Additionally, the drain of driving transistor 242, which is an NMOS device, is connected to power supply voltage 300 and the gate is connected to voltage control 222. As discussed below, voltage control 222 provides a voltage to drive control transistor 242 to Voh, the USB specified high state voltage. The resulting NMOS voltage versus current characteristic 314 (partially in phantom) is also shown on graph 310 of FIG. 9.

As discussed above, when input 210a goes high, USB driver 200 drives output 218 with first driving circuit 212 and then with second driving circuit 214. The portion of the characteristic curves 312 and 314 which drive output 218 are shown in graph 310 in solid lines. As shown, USB driver 200 switches from drive output 218 with first driving circuit 212 to second driving circuit 214 when the voltage at output 218 reaches Vcr, the point at which characteristic 312 intersects characteristic 314. Preferably, though not necessarily, Vcr is between 1.3 volts and 2.0 volts.

As shown in FIG. 9, the phantom portion of PMOS characteristic 312 terminates at horizontal axis 311 at VDD, which between about 4.75 volts and 5.25 volts. Where characteristics 312 and 314 intersect the horizontal axis 311 represents the maximum voltage to which output 218 would be driven. Thus, if output 218 were driven by first driving circuit 212 alone, a high state on output 218 would have a voltage VDD, which according to USB specifications is between 4.75 volts and 5.25 volts, and is above the high state USB specified voltage of between 2.8 and 3.6 volts.

Accordingly, on a transition of input 210a from a low to a high state, USB driver 200 drives output 218 with first driving circuit 212 up to Vcr and then drives output 218 from Vcr to Voh with second driving circuit 214. Under USB specifications, the rise time for a state change signal must be between 4 nanoseconds (ns) and 20 ns. As shown in FIG. 9, by the phantom portion of second driving circuit 214 characteristic curve 314, the current at voltages below Vcr generated by second driving circuit 214 are relatively high. Accordingly, if first driving circuit 214 were used to drive output 218 up to Vcr, the rise time for a state change signal may be too rapid and fall outside of USB specifications. Accordingly, because first driving circuit 212 generates a lower current for the voltage region below Vcr, as shown in FIG. 9, first driving circuit 212 is used to drive output 218 to Vcr. This advantageously allows the rise time of a state change signal to remain within USB specifications.

Further, because USB driver 200 drives output 218 with second driving circuit 214 from Vcr to Voh, there is no need to apply and remove driving current to maintain Voh, as was the case with the earlier driving circuit 50 shown in FIG. 3. Thus, substantially no ringing occurs when Voh is reached. This advantageously reduces the likelihood of a false state change reading in a USB signal driven by USB driver 200.

As will be explained in detail below, activation of first driving circuit 212 and second driving circuit 214 is controlled by output 302 of crossover detector 220. Activation circuit 217 either allows or disallows the signal on output 302 to reach first driving circuit 212 and second driving circuit 214. And, activation circuit 217 is controlled by enabling input 210a and non-enabling input 210b. Thus, USB driver 220 is activated to bring output 218 from a digital low state to a digital high state when enabling input 210a is brought high and non-enabling input 210b is brought low.

As shown in FIG. 8, inputs 210a and 210b are preferably connected to activation circuit 217. Activation circuit 217 allows first and second driving circuits 212 and 214 to pull output 218 to a high state when enabling input 210a is high and non-enabling input 210b is low. Preferably, activation circuit 217 includes first switching transistor 304, second switching transistor 306, third switching transistor 308, and forth switching transistor 310. First and second switching transistors 304 and 306, respectively, are preferably connected in parallel, and third and forth switching transistors 308 and 310, respectively, are preferably connected in parallel. Preferably, the gates of first switching transistor 304 and third switching transistor 308 are tied to non-enabling input 210b, and the gates of second switching transistor 306 and forth switching transistor 310 are tied to enabling input 210a. The drain of each switching transistor 304, 306, 308 and 310 is connected to output 302 of crossover detector 220. The sources of first and second switching transistors 304 and 306, respectively, drive first switching circuit 212 and the sources of third and forth switching transistors 308 and 310, respectively, drive second switching circuit 214. As shown in FIG. 8, first switching transistor 304 and third switching transistor 308 are preferably PMOS devices. Also, preferably, second switching transistor 306 and forth switching transistor 310 are NMOS devices. Accordingly when enabling input 210a is low and non-enabling input 210b is high, switching transistors 304, 306, 308 and 310 are turned off (non-conducting). In this way the signal from output 302 does not reach first driving circuit 212 or second driving circuit 214, and output 218 remains low.

Additionally, activation circuit 217 preferably includes first de-activation transistor 312 and second de-activation transistor 314 to de-activate first driving circuit 212 and second driving circuit 214, respectively. The gate of first deactivation transistor 312 is connected to non-enabling input 210b, the source thereof is grounded, and the drain thereof is connected to the gate of cutout transistor 230 of first switching circuit 212. The drain of first cutout transistor 230 is connected to voltage supply 300 and the source of first cutout transistor 230 is connected to the gate of driving transistor 232. Additionally, first de-activation transistor 312 is an NMOS device and both cutout transistor 230 and driving transistor 232 are PMOS devices. Accordingly, when non-enabling input 210b is high the gate of cutout transistor 230 is grounded and cutout transistor 230 is turned on. This brings the gate of driving transistor 232 high which turns off driving transistor 232.

The gate of second de-activation transistor 314 is preferably connected to enabling input 210a, the drain is connected to cutout transistor 240 of second driving circuit 214 and the source is connected to power supply 300. The source of cutout transistor 240 is grounded and the drain thereof is attached to the gate of driving transistor 242. Further, second de-activation transistor 314 is preferably a PMOS device, and both cutout transistor 240 and driving transistor 242 are NMOS devices. Accordingly, when enabling input 210a is low, de-activation transistor 314 is turned on and the gate of cutout transistor to 240 is high. This grounds of the gate of driving transistor 242 which turns off driving transistor 242. In this way, when non-enabling input 210b is high and enabling input 210a is low, first and second switching circuits 212 and 214, respectively, are disabled and do not receive a control signal from crossover detector 220. Thus, output 218 remains low.

When non-enabling input 210b is switched low and enabling input 210a is switched high, driving circuit 200 preferably drives output 218 to a high state. When non-enabling input 210b goes low switching transistors 304 and 308 are turned on. Additionally when enabling input 210a goes high switching transistors 306 and 310 are turned on. This allows the signal on output 302 to drive first switching circuit 212 and second switching circuit 214. Further, de-activation transistor 312 is turned off which allows the signal on output 302 to turn off cutout transistor 230. In this way, the gate of driving transistor 232 is not pulled up to supply voltage 300, which allows driving transistor 232 to be turned on. Also, de-activation transistor 314 is turned off, which turns off cutout transistor 240. This removes the gate of driving transistor 242 from ground which allows driving transistor 242 to be turned on.

As noted above, the signal from output 302 of crossover detector 220 determines whether driving circuit 212 or driving circuit 214 is used drive output 218. Output 302 is driven by comparator 316 which has first input 317 and second input 319. As will be explained below, first input 317 of comparator 316 is held at the crossover voltage, Vcr, by crossover detector 220. Second input 319 is inverted and preferably connected to output 218. When the voltage on output 218 is lower than the crossover voltage, the output of comparator 316 is high and when voltage output 218 is higher than the crossover voltage the output of comparator 316 is low. When USB driver 200 is first enabled the voltage of output 218 will be lower than the crossover voltage. Thus, the output of comparator 316 will be high.

Preferably, when output 302 is high and USB driver 200 is enabled, first driving circuit 212 is activated to pull up output 218 and second driving circuit 214 is de-activated. Because switching transistors 304, 306, 308 and 310 are turned on when enabling input 210a is high and non-enabling input 210b is low, the signal from output 302 is passed to first switching circuit 212 and second switching circuit 214. As noted above, first switching circuit 212 includes switching transistors 234 and 236, which are wired in parallel to each other, cutout transistor 230 and driving transistor 232. The gate of switching transistor 234 is connected to output 302. The gate of switching transistor 236 is also connected to output 302 through inverter 238.

Switching transistor 234 is preferably an NMOS device and switching transistor 236 is preferably a PMOS device. Accordingly, when output 302 is high, both switching transistors 234 and 236 are turned on, because the signal feeding the gate of switching transistor 236 is inverted by inverter 238. The drains of switching transistors 234 and 236 are preferably connected to P-bias voltage 216, and the sources of switching transistors 234 and 236 are connected to the gate of driving transistor 232. Thus, when switching transistors 234 and 236 are turned on, P-bias voltage 216 is connected to the gate of driving transistor 232. In this way, driving transistor 232 will begin to pull up output 218.

Driving transistor 232 will continue to pull output 218 up until output 218 reaches the crossover voltage Vcr. When this happens the voltage of input 319 of comparator 316 will match, and then exceed, the voltage of input 317. When this occurs output 302 of comparator 316 will transition to a low state. This low state will be transmitted to switching transistors 234 and 236 of first switching circuit 212 via switching transistors 304 and 306. This will cause switching transistors 234 and 236 to turn off, thereby cutting off the P-bias voltage 216 signal from the gate of driving transistor 232. Additionally, cutout transistor 230 will be turned on, pulling the gate of driving transistor 232 high and turning off driving transistor 232.

At the same time, output 302 activates driving circuit 214 via switching transistors 308 and 310. Output 302 is connected to the gate of switching transistor 244 and to the input of inverter 248, which is in turn connected to the gate of switching transistor 246. Switching transistor 244 is a PMOS device and switching transistor 246 is an NMOS device. Further, as discussed above, when the voltage on output 218 exceeds the crossover voltage, output 302 of comparator 316 goes low. Thus, switching transistors 244 and 246 are turned on. Also, the signal from output 302 is connected to the gate of cutout transistor 240, which is an NMOS device. Thus, when output 302 is low, cutout transistor 240 is turned off and the gate of driving transistor 242 is not grounded. Accordingly, output 320 of voltage control 222 can drive the gate of driving transistor 242. As explained below, voltage control 222 causes driving transistor 242 to pull output 218 up to Voh and hold it there until USB driver 200 is de-activated again (by changing the states of enabling input 210a and non-enabling input 210b.)

FIG. 10 is a schematic diagram of a preferred embodiment of voltage supply 222. Voltage supply 222 preferably includes control transistor 332 connected in series to resistor 334, and operational amplifier (op amp) 330. Preferably, the drain of control transistor 332 is connected to supply voltage 300 and the source thereof is connected to ground through resistor 334. Voltage supply 222 also preferably includes a voltage divider which includes resistors 336 and 338 connected in series between ground and supply voltage 300. The output of the voltage divider is preferably taken between resistors 336 and 338 and is preferably connected to first input 331 of op amp 330. Second input 333 of op amp 330 is preferably connected to the source of control transistor 332 the output 320 of op amp 330 is preferably fed back to the gate of control transistor 332.

As noted above voltage, control 222 causes driving transistor 242 to pull output 218 up to Voh and hold it there. To accomplish this, the size of control transistor 332 corresponds to the size of driving transistor 242. Preferably, driving transistor 242 is ten times the size of control transistor 332. Additionally, resistor 334 is sized to correspond to resistor 20 of FIG. 1 which, as explained in the background section, would be connected in series with output 218. Preferably, resistor 334 is ten times the value of resistor 20. Finally, resistors 336 and 338 are preferably sized such that the output of the voltage divider is set to Voh. Because the source of control transistor is connected to first input 333 of op amp 330, and first input 331 to op amp 330 is held at Voh, tying the output 320 of op amp 330 to the gate of control transistor 332 causes the output of op and 330 to generate a voltage which will hold the source of control transistor 330 at Voh. Because driving transistor 242 and resistor 20 are matched to control transistor 332 and resistor 334, respectively, and because output 320 of op and 330 also drives the gate of driving transistor 242, the source of driving transistor 242 will pull output 218 up to Voh and hold it there.

As explained above, input 317 to comparator 316 provides comparator 316 with the crossover voltage where, as shown in FIG. 9, the characteristic of PMOS driving transistor 232 intersects with the characteristic of NMOS driving transistor 242. As shown in FIG. 11, to accomplish this, in addition to comparator 316, crossover detector 220 preferably includes NMOS control transistor 340, PMOS control transistor 342 and current mirror 360. NMOS control transistor 340 is preferably sized to correspond with driving transistor 242. Specifically, NMOS control transistor 340 is preferably one-tenth the size of driving transistor 242. Also, PMOS control transistor 342 is preferably sized to correspond with driving transistor 232. Specifically PMOS control transistor 342 is preferably one-tenth the size of driving transistor 232. The gate of NMOS control transistor 340 is preferably connected to the output of voltage control 222 and the drain thereof is preferably connected to supply voltage 300. The gate of PMOS control transistor 342 is preferably connected to P-bias voltage 216, and the drain thereof is preferably connected to supply voltage 300.

Current mirror 360 preferably includes transistors 344, 346, 348 and 350, all of which are matched in size. The gates of transistors 344 and 346 are preferably tied together and the gates transistors 348 and 350 are preferably tied together. The sources of transistors 344, 346, 348 and 350 are preferably all grounded. The source of NMOS control transistor 340 is preferably connected to the gates of transistors 344 and 346 and the drains of transistors 344 and 348. The source of PMOS control transistor 342 is preferably tied to the gates of transistors 348 and 350 and to the drains of transistors 346 and 350. Because the gate of transistors 344 and 346 are tied together, and the gates of transistor 348 and 350 are tied together, the currents through transistors 344 and 346 will be equal and the currents through transistors 348 and 350 will be equal. Additionally because the source of NMOS control transistor 340 is tied to the drains of transistors 344 and 348, and the source of PMOS control transistor 342 is tied to the drains of transistors 346 and 350, the currents through each transistor 344, 346, 348 and 350 will be the same. Thus, the current through NMOS control transistor 340 will match the current through PMOS control transistor 342. In this way, because NMOS control transistor 340 corresponds in size to driving transistor 242 and PMOS control transistor 342 corresponds in size to driving transistor 232, the source of NMOS control transistor 340 will be held at the crossover voltage. Thus, input 317 to comparator 316 which is connected to the source of NMOS control transistor 340, will be held the crossover voltage.

It will be understood that the foregoing description and drawings of a preferred embodiment is merely illustrative of the principles of this invention, and that various modifications can be made by those skilled in the art without departing from the scope and spirit of the invention.

What is claimed:

1. An electronic output driver comprising:
   an output for providing an electrical signal;
   a first pull-up circuit having a first current-voltage (I–V) characteristic and for providing voltage to the output;
   a second pull-up circuit for driving the output to a predetermined target voltage and having a second I–V characteristic which has at least one point in common with the first I–V characteristic; and
   a detection circuit in electrical communication with the first pull up circuit and the second pull up circuit, the detection circuit for detecting a voltage of the output and for switching the output from being driven by the first pull-up circuit to being driven by the second pull-up circuit at a voltage which corresponds to the at least one point in common between the first I–V characteristic and the second I–V characteristic.

2. The output driver of claim 1 wherein:
   the first pull-up circuit includes a driver which is a PMOS device; and
   the second pull-up circuit includes a driver which is an NMOS device.

3. The output driver of claim 2 including a voltage control circuit interconnected to the second pull-up circuit, the voltage control circuit for controlling the voltage to which the second pull-up circuit drives the output.

4. The output driver of claim 3 including:
   at least one signal input; and
   an enabling circuit connected to the signal input, the first pull-up circuit and the second pull-up circuit, the enabling circuit for at least activating the first pull-up circuit and second pull-up circuit depending upon the state of the at least one signal input.

5. The output driver of claim 1 wherein the output driver is for driving a universal serial bus.

6. A method of driving an electrical output of an output driver including:
   providing a first pull-up circuit for driving the output and having a first current-voltage characteristic;
   providing a second pull-up circuit having a second current-voltage characteristic which has at least one point in common with the first current-voltage characteristic, the second pull-up circuit for driving the output up to a predetermined voltage;
   driving the output with either the first pull-up circuit or the second pull-up circuit; and
   switching the output from being driven by the first pull-up circuit to the second pull-up circuit at a voltage which corresponds to the at least one point in common between the first current-voltage characteristic and the second current-voltage characteristic.

7. The method of claim 6 wherein:
   the step of providing a first pull-up circuit includes providing a first pull-up circuit having at least one driving transistor which is a PMOS device; and
   the step of providing a second pull-up circuit includes providing a second pull-up circuit having at least one driving transistor which is an NMOS device.

8. The method of claim 7 including:
   providing a voltage control circuit interconnected to the second pull-up circuit; and
   using the voltage control circuit to control the voltage to which the second pull-up circuit drives the output.

9. The method of claim 8 including:
   providing an input to the output driver;
   providing enabling circuit to which the input is connected and which is connected to the first pull-up circuit and the second pull-up circuit; and
   enabling and disabling the first pull-up circuit and the second pull-up circuit with the enabling circuit depending upon the state of the input.

* * * * *